United States Patent [19]

Burkes et al.

[11] Patent Number: 5,542,065

[45] Date of Patent: *Jul. 30, 1996

[54] METHODS FOR USING NON-CONTIGUOUSLY RESERVED STORAGE SPACE FOR DATA MIGRATION IN A REDUNDANT HIERARCHIC DATA STORAGE SYSTEM

[75] Inventors: Theresa A. Burkes, Meridian; Bryan M. Diamond, Boise; Michael B. Jacobson, Boise; Marvin D. Nelson, Boise; Douglas L. Voigt, Boise, all of Id.

[73] Assignee: Hewlett-Packard Company, Palo Alto, Calif.

[*] Notice: The term of this patent shall not extend beyond the expiration date of Pat. No. 5,392,244.

[21] Appl. No.: 386,573

[22] Filed: Feb. 10, 1995

[51] Int. Cl.⁶ .................................................. G06F 12/12
[52] U.S. Cl. ........................... 395/441; 395/416; 395/481
[58] Field of Search .................................. 395/416, 417, 395/441, 481

[56] References Cited

U.S. PATENT DOCUMENTS

| 5,095,420 | 3/1992 | Eilert et al. | 395/416 |
|---|---|---|---|
| 5,155,835 | 10/1992 | Belsan | 395/441 |
| 5,195,100 | 3/1993 | Katz et al. | 395/182.2 |
| 5,237,658 | 8/1993 | Walker et al. | 395/858 |
| 5,278,838 | 1/1994 | Ng et al. | 395/182.04 |
| 5,287,462 | 2/1994 | Jibbe et al. | 395/856 |
| 5,289,418 | 2/1994 | Youngerth | 365/201 |
| 5,297,258 | 3/1994 | Hale et al. | 395/441 |
| 5,392,244 | 2/1995 | Jacobson et al. | 395/404 |
| 5,416,915 | 5/1995 | Mattson et al. | 395/441 |
| 5,488,701 | 1/1996 | Brady et al. | 395/182.04 |

OTHER PUBLICATIONS

PC Tools deluxe ver. 6, Data Recovery, Dos Shell Manual, ©1990 Central Point Software, Inc., pp. 258,259,320,321.

Primary Examiner—David L. Robertson

[57] ABSTRACT

A hierarchic disk array data storage system has multiple storage disks that define a physical storage space and a RAID management system that maps the physical storage space into two virtual storage spaces. A RAID-level virtual storage space presents the physical storage space as mirror and parity RAID areas where the mirror RAID areas store data according to RAID Level 1 and the parity RAID areas store data according to RAID Level 5. An application-level virtual storage space presents the physical storage space as multiple virtual blocks. The RAID management system migrates data between the mirror and parity RAID areas to optimize performance and reliability. To facilitate migration, the RAID management system guarantees a minimum of unused storage space that can be used to empty a RAID area for the purpose of converting the RAID level or other storage attribute of the RAID area. The minimum unused storage space is preferably equivalent in size to at least one largest parity RAID area. However, the unused storage space is not in any one physical location, but can be allowed to distribute itself over various RAID areas in a non-contiguous manner across the storage disks.

10 Claims, 10 Drawing Sheets

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T−1 | T−1' | T | T' | S |

FIG. 2

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R−2 | R−1 | R | Q |

FIG. 3

METHODS FOR USING NON-CONTIGUOUSLY RESERVED STORAGE SPACE FOR DATA MIGRATION IN A REDUNDANT HIERARCHIC DATA STORAGE SYSTEM

FIELD OF THE INVENTION

This invention relates to data storage systems, such as a hierarchic disk array data storage systems, and methods for using reserved storage space for data migration within such systems.

BACKGROUND OF THE INVENTION

Computer systems are constantly improving in terms of speed, reliability, and processing capability. As a result, computers are able to handle more complex and sophisticated applications. As computers improve, performance demands placed on mass storage and input/output (I/O) devices increase. There is a continuing need to design mass storage systems that keep pace in terms of performance with evolving computer systems.

This invention particularly concerns the mass storage systems of the disk array type. Disk array data storage system have multiple storage disk drive devices which are arranged and coordinated to form a single mass storage system. There are three primary design criteria for mass storage systems: cost, performance, and availability. It is most desirable to produce memory devices that have a low cost per megabyte, a high input/output performance, and high data availability. "Availability" is the ability to access data stored in the storage system and the ability to insure continued operation in the event of some failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

SUMMARY OF THE INVENTION

This invention provides a hierarchic data storage system that stores data according to different redundancy techniques to optimize performance and reliability. The data storage system includes a disk array having a plurality of storage disks and a disk array controller which coordinates data transfer to and from the disks. The storage disks define a physical storage space. The data storage system also includes a RAID management system operatively coupled to the disk array controller for mapping two virtual storage spaces onto the physical storage space of the storage disks. The first or Raid-level virtual storage space presents the physical storage space as multiple mirror and parity RAID areas. The mirror RAID areas contain mirror allocation blocks that store data according to RAID Level 1 (mirror redundancy) and the parity RAID areas contain parity allocation blocks that store data according to RAID Level 5 (parity redundancy). The second or application-level virtual storage space presents the physical storage space as multiple virtual blocks.

The RAID management system migrates data between the mirror and parity allocation blocks so the data undergoes a change in redundancy between RAID Level 1 (i.e., mirror redundancy) and RAID Level 5 (i.e., parity redundancy) in a manner which optimizes performance and reliability. To facilitate migration, the RAID management system reserves an amount of unused storage space within the RAID-level virtual storage space to temporarily which can be the target of data moves during the migration. The unused storage space is preferably equivalent in size to one RAID area. However, the unused storage space is not in any one RAID area or any one physical location, but can be allowed to distribute over various RAID areas in a non-contiguous manner across the storage disks.

According to one method of this invention, the RAID management system employs the non-contiguous unused space to assist in creating mirror allocation blocks. The method includes several possible techniques that make use of the unused storage space. The techniques are sequentially tried until at least one mirror allocation block is created. The first technique is to locate an unused RAID area and convert it to a mirror RAID area containing at least one usable mirror allocation block. The second technique is to gather the empty parity allocation blocks into an unused RAID area which can be converted to a mirror RAID area containing at least one usable mirror allocation block. The third technique is to alternately perform the following steps (a) and (b) until an unused RAID area is created, and to then perform step (c): (a) migrate data from mirror allocation blocks to parity allocation blocks to empty the mirror allocation block; (b) gather the empty mirror allocation blocks into an unused RAID area; and (c) convert the unused RAID area into a parity RAID area. The steps (a)–(c) of the third technique are repeated until an unused RAID area is created that can be converted into a mirror RAID area without violating the minimum reserved amount of unused storage space.

According to another method of this invention, the RAID management system empties an entire RAID area for use in sizable data movement operation, such as rebuild tasks, adding new storage disks, and the like. The RAID management system first locates a RAID area (mirror or parity) that is only partially filled with data. The data is then moved from the RAID area to unused storage space. This leaves the RAID area empty and ready for conversion to a mirror or parity RAID area.

DESCRIPTION OF THE DRAWINGS

Preferred embodiments of the invention are described below with reference to the following accompanying drawings depicting examples embodying the best mode for practicing the invention.

FIG. 2 is a diagrammatic illustration of storage space on multiple storage disks and shows data storage according RAID Level 1.

FIG. 3 is a diagrammatic illustration of storage space on multiple storage disks and shows data storage according RAID Level 5.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Figure 1:
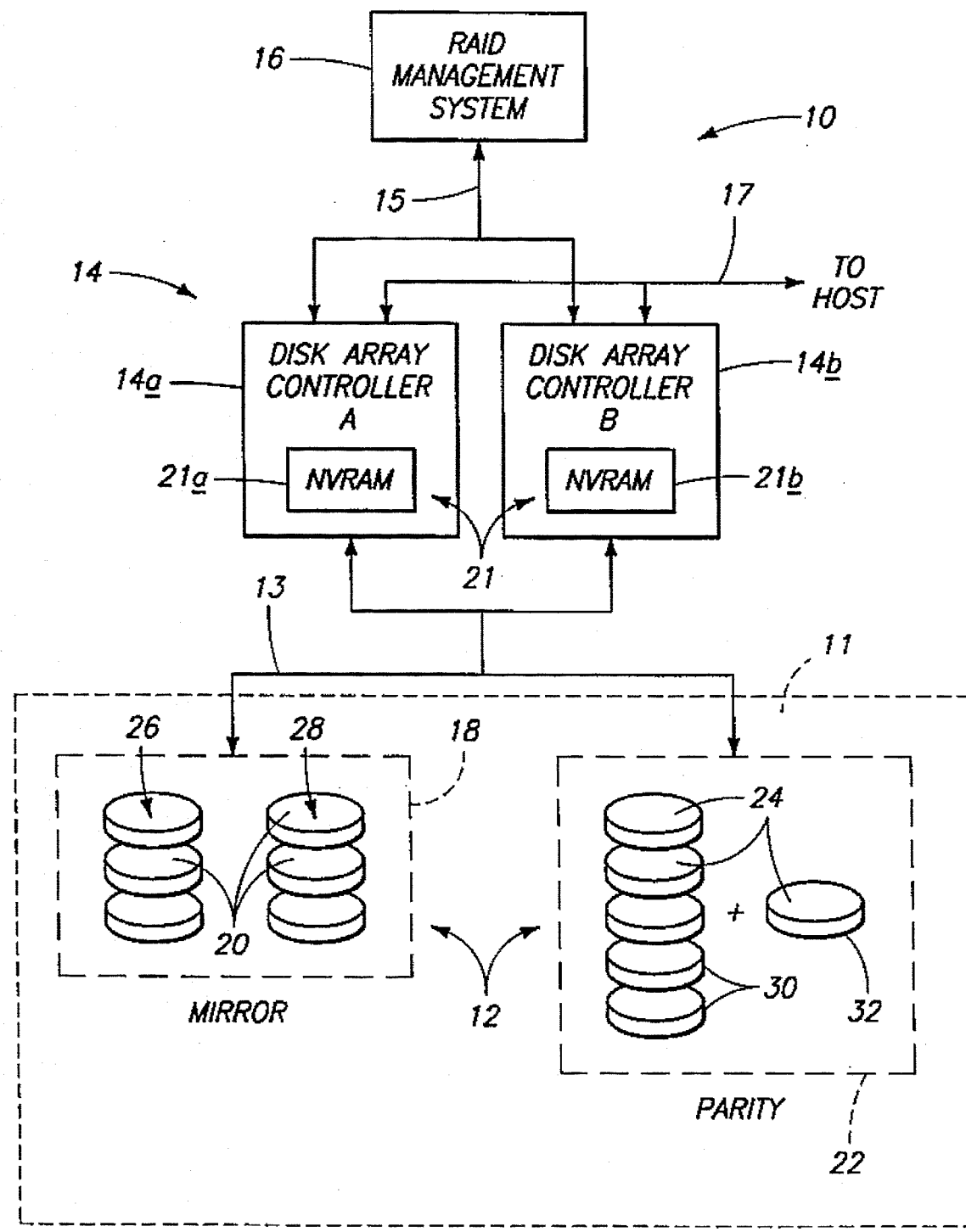
FIG. 1 is a diagrammatic block diagram of a disk array data storage system according to this invention.

FIG. 1 shows a data storage system 10 constructed according to this invention. Preferably, data storage system 10 is a disk array data storage system which includes a hierarchic disk array 11 having a plurality of storage disks 12, a disk array controller 14 coupled to the disk array 11 to coordinate data transfer to and from the storage disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RaidBook: A Source Book for RAID Technology,* published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14 or within the host computer to provide a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. Dual controllers 14a and 14b enhance reliability by providing continuous backup and redundancy in the event that one controller becomes inoperable. This invention can be practiced, however, with a single controller or other architectures.

The hierarchic disk array 11 can be characterized as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Data storage system 10 includes a memory map store 21 that provides for persistent storage of the virtual mapping information used to map different storage spaces onto one another. The memory map store is external to the disk array, and preferably resident in the disk array controller 14. The memory mapping information can be continually or periodically updated by the controller or RAID management system as the various mapping configurations among the different views change.

Preferably, the memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the data storage system 10. One preferred construction is a self-refreshing, battery-backed DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, disk array 11 has multiple storage disk drive devices 12. Example sizes of these storage disks are one to three Gigabytes. The storage disks can be independently connected or disconnected to mechanical bays that provide interfacing with SCSI bus 13. In one implementation, the data storage system is designed with twelve active mechanical bays. Four SCSI buses are used to interface these bays with disk array controller 14 (i.e., one bus per three mechanical bays). If the active bays are fully loaded, the data storage system has an example combined capacity of 12–36 Gigabytes. Disk array controller 14 recognizes storage disks 12 regardless into which bay they are plugged. The data storage system 10 is designed to permit "hot plug" of additional disks into available mechanical bays in the disk array while the disk array is in operation.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "$\oplus$". The parities for the first four stripes (with the subscript numeral representing the corresponding stripe) are as follows:

$P_0$ = Segment 0 $\oplus$ Segment 1 $\oplus$ Segment 2
    = Disk 0 $\oplus$ Disk 1 $\oplus$ Disk 2
$P_1$ = Segment 3 $\oplus$ Segment 4 $\oplus$ Segment 5
    = Disk 0 $\oplus$ Disk 1 $\oplus$ Disk 3
$P_2$ = Segment 6 $\oplus$ Segment 7 $\oplus$ Segment 8
    = Disk 0 $\oplus$ Disk 2 $\oplus$ Disk 3
$P_3$ = Segment 9 $\oplus$ Segment 10 $\oplus$ Segment 11
    = Disk 1 $\oplus$ Disk 2 $\oplus$ Disk 3

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. The regions are grouped together to form RAID areas in one virtual view of the storage space. Additionally, another (host-defined) view of storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 tries to place the more performance-critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently accessed data is maintained in the mirror RAID area 18 while the less recently accessed data is stored in parity RAID area 22. Other performance protocols may be employed. Ideally, such protocols are defined based upon the specific computer application and the needs of the user.

Additionally, the RAID management system 16 automatically "tunes" the storage resources of a data storage system according to a function of two parameters: size of the physical storage capacity and size of the present amount of user data being stored in the data storage system. Initially, all data is stored in mirror RAID areas because this affords the highest performance and reliability. As more data is added to the data storage system, the data is migrated between mirror RAID areas and parity RAID areas to optimize performance and reliability. As the data storage system approaches full capacity, more and more data is migrated to parity RAID areas in an effort to meet all demands by the user while still providing reliability through redundancy. Accordingly, the data storage system of this invention affords maximum flexibility and adaptation. It does not require the user to select a specific storage regime, but instead can adapt to any demand placed on it by the user.

Figure 4:
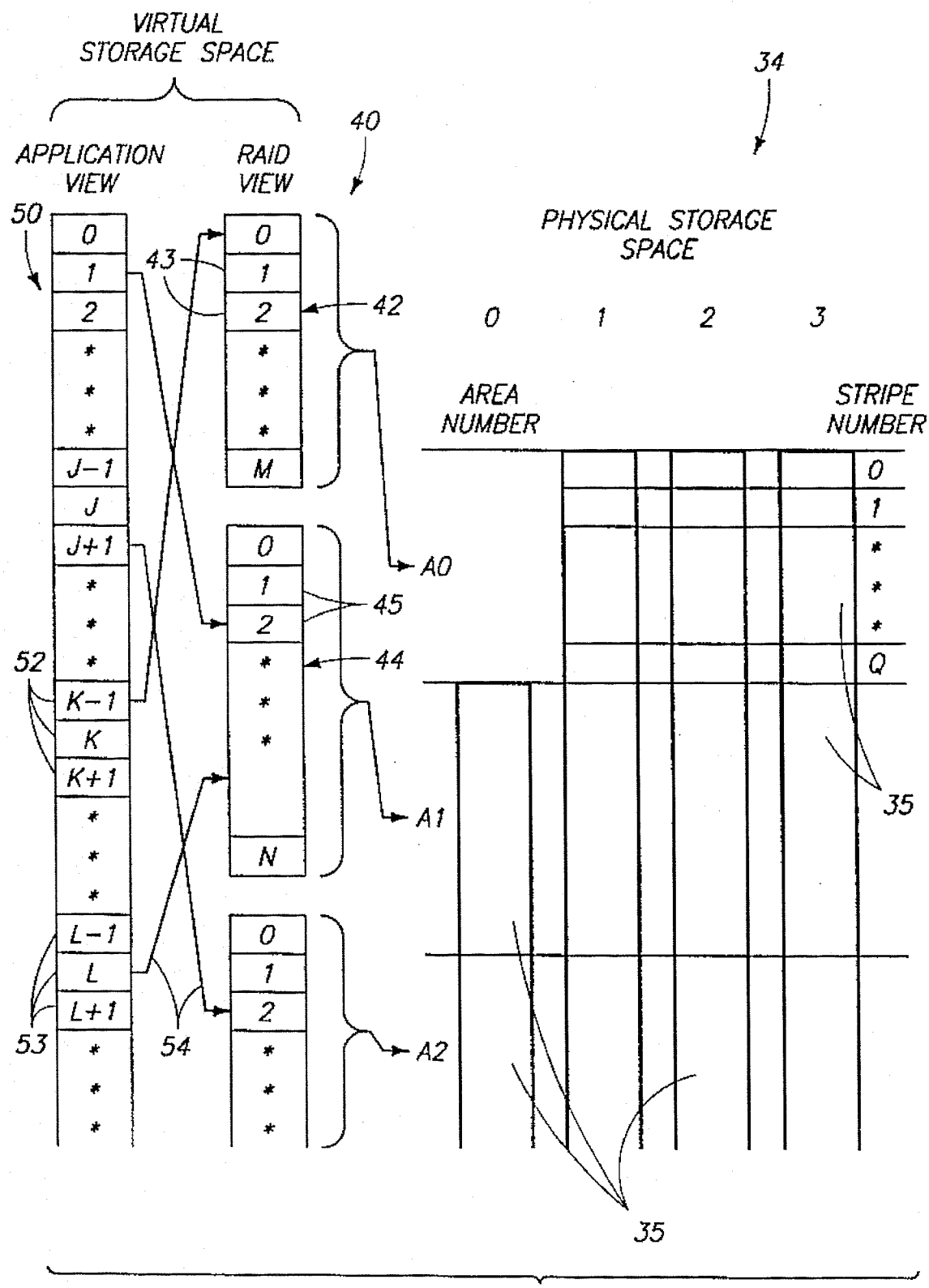
FIG. 4 is a diagrammatic illustration of a memory mapping arrangement of this invention where two virtual storage spaces are mapped onto a physical storage space.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. Example storage capacities for such disks are 1–3 Gigabytes. The storage space 34 is partitioned into areas A0, A1, A2, etc. Individual areas contain numerous stripes, such as stripes 0–Q in area A0. Individual areas also contain numerous regions 35. Regions 35 preferably consist of a selected number of uniform sized segments on every storage disk so that the regions are equal in size across the entire disk array. An example size of one region 35 is one Megabyte.

The storage space of the disks are mapped into a first, intermediate, RAID-level virtual view 40 of the physical storage space 34. This first virtual view is conceptually a set of RAID areas which can be mapped to a second application view that represents a contiguously addressable storage space. The physical configuration and RAID views of the storage space are hidden from the application view.

The RAID area storage space 40 is the view of storage that identifies the mirror and parity storage space. For instance, a RAID area 42 may represent a mirror RAID area of M allocation blocks 43 while RAID area 44 may represent a parity RAID area of N allocation blocks 45. The allocation blocks 43 and 45 are preferably equal sized, with an example size being 64 Kilobytes. These RAID areas relate to corresponding physical areas A0, A1, A2, etc., on the physical storage space 34. As an example, sixteen 64K allocation blocks 43 or 45 at the RAID virtual view can be mapped onto a single 1M region 35.

The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area. It is also noted that the RAID areas are shown as being mapped into contiguous areas on the disk array, where each region associated with a RAID area is located at the same physical address on each storage disk. The RAID areas may alternatively be mapped into non-contiguous areas on the disk array as well.

The storage space available in the RAID areas is mapped into a second, front end, application-level virtual view 50 which is a view of storage as defined by and presented to the user or host application program. When viewed by the user or host application program, the application-level virtual view 50 can represent a single large storage capacity indicative of the available storage space on storage disks 12. Virtual storage space 50 presents a view of a linear set of equal sized storage virtual blocks 52 and 53, referenced individually as 0, 1, 2, . . . J–1, J, J+1, . . . , L–1, L, L+1, . . . , etc. Virtual blocks 52 and 53 are preferably the same size as the allocation blocks in RAID area 40, with an example size being 64 Kilobytes. The virtual block storage space 50 is represented by a table of references or pointers (as represented by arrows 54) to allocation blocks in the view presented by RAID areas 40. Virtual blocks 52 and 53 at the application virtual view 50 are therefore associated with allocation blocks 43 and 45 at the RAID virtual view 40 via the pointers maintained in the virtual block table. There are at least two types of RAID areas that can be referenced from the virtual block table: mirror and parity.

The RAID management system 16 can dynamically alter the configuration of the RAID areas over the physical storage space. The number of RAID areas for each type may be increased or decreased depending upon the amount of user data being stored in the system and the size of the physical disk storage space. As a result, the mapping of the RAID areas in the RAID-level virtual view 40 onto the disks and the mapping of the front end virtual view 50 to RAID view 40 are generally in a state of change. The memory map store in NVRAMs 21a and 21b (FIG. 1) maintains the current mapping information used by RAID management system 16 to map the RAID areas onto the disks, as well as the information employed to map between the two virtual views. As the RAID management system dynamically alters the RAID level mappings, it also updates the mapping information in the memory map store to reflect the alterations.

The migration operation of memory system 10 will now be described with reference to FIGS. 1 and 4.

For purposes of continuing explanation, virtual blocks 53 of the application-level virtual storage space 50 reference associated allocation blocks 45 in parity RAID area 44 stored in area A1 of physical storage space 34. Such virtual blocks 53 are referred to as "parity virtual blocks" while the associated allocation blocks 45 are referred to as "parity allocation blocks". Similarly, virtual blocks 52 reference associated allocation blocks 43 in mirror RAID area 42 stored in area A0 of physical storage space 34. Such virtual blocks 52 are referred to herein as "mirror virtual blocks" while the associated allocation blocks 43 are referred to as "mirror allocation blocks".

In general, to migrate data from one RAID area to another, a virtual block associated with an allocation block of a first RAID level type (such as mirror or Level 1) is selected. Then, an unused allocation block representing a second RAID level type (such as parity or Level 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the mapping 54 of the application-level virtual storage space 50 to the RAID-level virtual storage space 40 is modified and updated to reflect the shift of data. The selected virtual block that was formerly associated with an allocation block of the first RAID level type now references via an updated pointer an allocation block of the second RAID level type which contains the migrated data. Any mapping change occurring during this transaction would be updated in memory map store 21.

The continuing discussion provides a more detailed explanation of migrating data between mirror and parity storage areas according to preferred methods and sequences of this invention. To migrate data from parity to mirror storage, the following sequence is employed:

1. The RAID management system locates an unused mirror allocation block 43 in a mirror RAID area 42.
2. If none can be found, the RAID management system creates a mirror allocation block (discussed below).
3. The RAID management system suspends new storage requests to the virtual block to be migrated.
4. The RAID management system waits until all active data storage requests to the virtual block are completed.
5. The data from the parity allocation block 45 associated with virtual block 53 is read into a temporary memory buffer.
6. The data is then written to the mirror allocation block 43 chosen in step 2.
7. The virtual block table is modified to reference the new location of the data in the mirror allocation block 43.
8. The suspended storage requests are resumed.

According to the above procedure, a virtual block 53 in the application-level virtual view 50 migrated from parity to mirror storage. Relative to the intermediate virtual view 40, data has migrated from a parity allocation block 45 in parity RAID area 44 to a mirror allocation block 43 in mirror RAID area 42. In the physical storage space data has moved from area A1 to area A0.

To migrate data from mirror to parity storage, the following sequence is employed:

1. The RAID management system chooses a virtual block from 52 to migrate from mirror to parity storage according to a migration policy such as access recency or access frequency.
2. The RAID management system locates an unused parity allocation block 45 in a parity RAID area 44.
3. If such a block cannot be found, space reserved for migration is converted to a parity RAID area according to the above described creation techniques.
4. New storage requests to the virtual block to be migrated are suspended.
5. The RAID management system waits until all active storage requests to the virtual block are completed.
6. Data is read from the mirror allocation block 43 associated with virtual block 52 into a temporary memory buffer.
7. The data is written to the chosen parity allocation block 45.
8. The virtual block table is modified to reference the new location of the data in parity allocation block 45.
9. Data requests to the virtual block are resumed.

The above two enumerated sequences provide examples of how the memory system of this invention can operate to migrate data between two different levels of redundancy.

The data storage system of this invention reserves an amount of unused storage space for data migration and other operations (for example, step 3 in the mirror-to-parity migration process above). Another goal of the system, however, is to keep as much user data in mirror virtual blocks as possible because mirror redundancy offers the highest performance and reliability. Yet, there is only a finite amount of physical storage space in the disk array. Initially, no physical storage space is consumed. Mirror allocation blocks then begin to consume the physical capacity as data is stored in the disk array. The term "physical capacity" refers to the storage capacity available for storing user data and redundant data. Mirror storage effectively clogs the disk array when user data consumes one-half of the physical capacity. At this point, one-half of the physical capacity is used to store user data and the remaining one-half of the physical capacity is used to store the redundant data.

Also at this point, all used virtual blocks are kept in mirror storage. If the mirror storage consumes so much of the physical storage space that the amount of unused RAID space is less than that of a RAID area, the data storage system can no longer guarantee migration of a single mirror allocation block to parity RAID areas. The next client data request that uses a previously unused allocation block will fail since the amount of unused space is less than that of a RAID area and cannot be converted to parity storage for migrating single allocation blocks out of mirror storage. This situation must be avoided.

Figure 5:
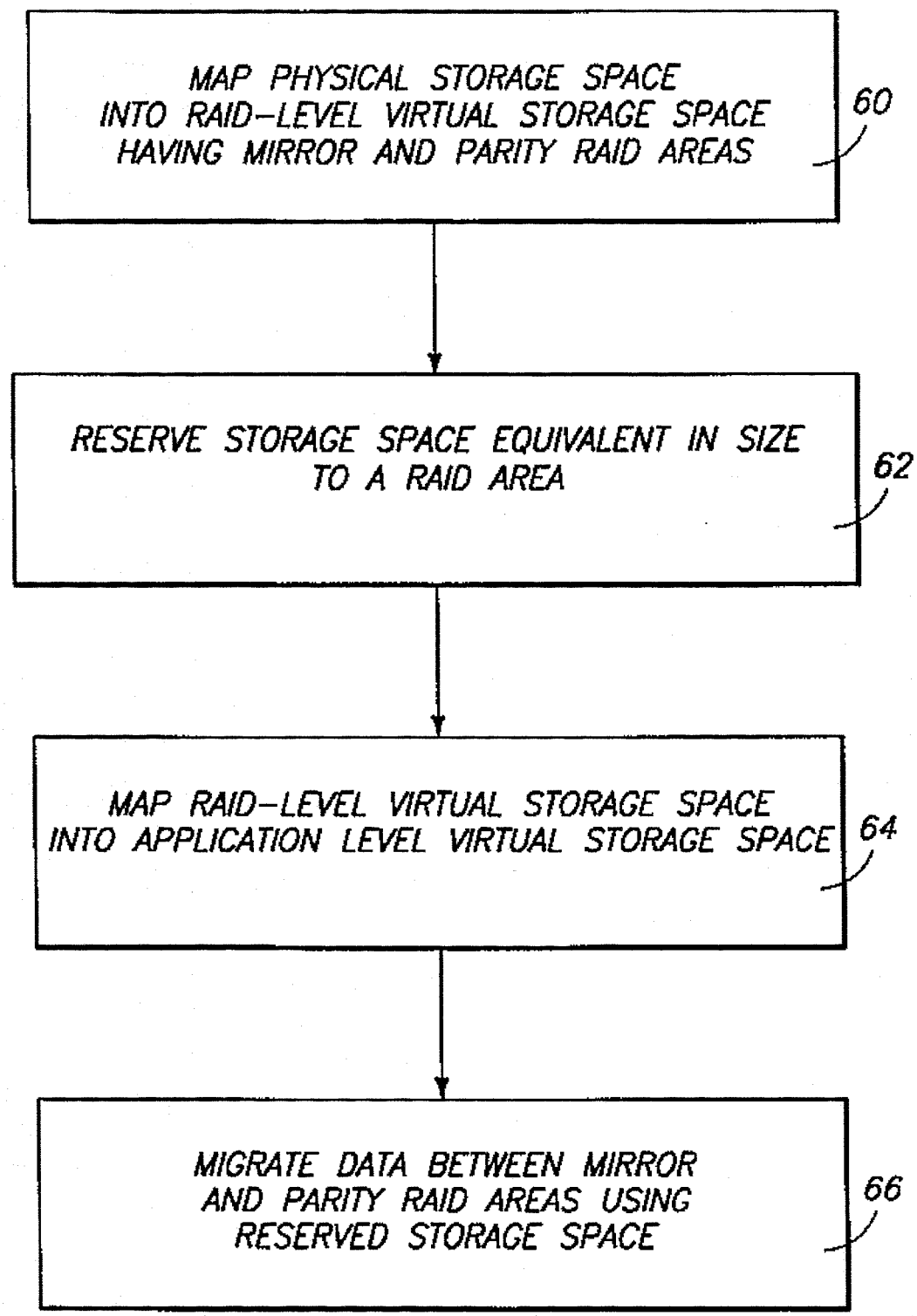
FIG. 5 is a flow diagram of a general preferred method of this invention.

RAID management system 16 therefore reserves a sufficient amount of unused storage space for data migration and conducts various processes to ensure this unused storage threshold is not violated. FIG. 5 illustrates a general procedure of this invention. At step 60, RAID management system 16 maps the physical storage space provided by disk array 12 into a first or RAID-level virtual storage space 40 (FIG. 4). The RAID-level virtual storage space presents the physical storage space as mirror and parity RAID areas. The mirror RAID areas contain mirror allocation blocks which store data according to mirror redundancy or RAID Level 1. The parity RAID areas contain parity allocation blocks which store data according to parity redundancy or RAID Level 5. At step 62, the RAID management system reserves an amount of unused storage space in the RAID-level virtual storage space 40. The amount of reserved unused storage space is equivalent to the amount of storage space in one RAID area. The unused storage space need not be reserved in a preselected contiguous RAID area. Instead, the method of this invention uses unused storage space that can be distributed non-contiguously over more than one RAID area.

Figure 6:
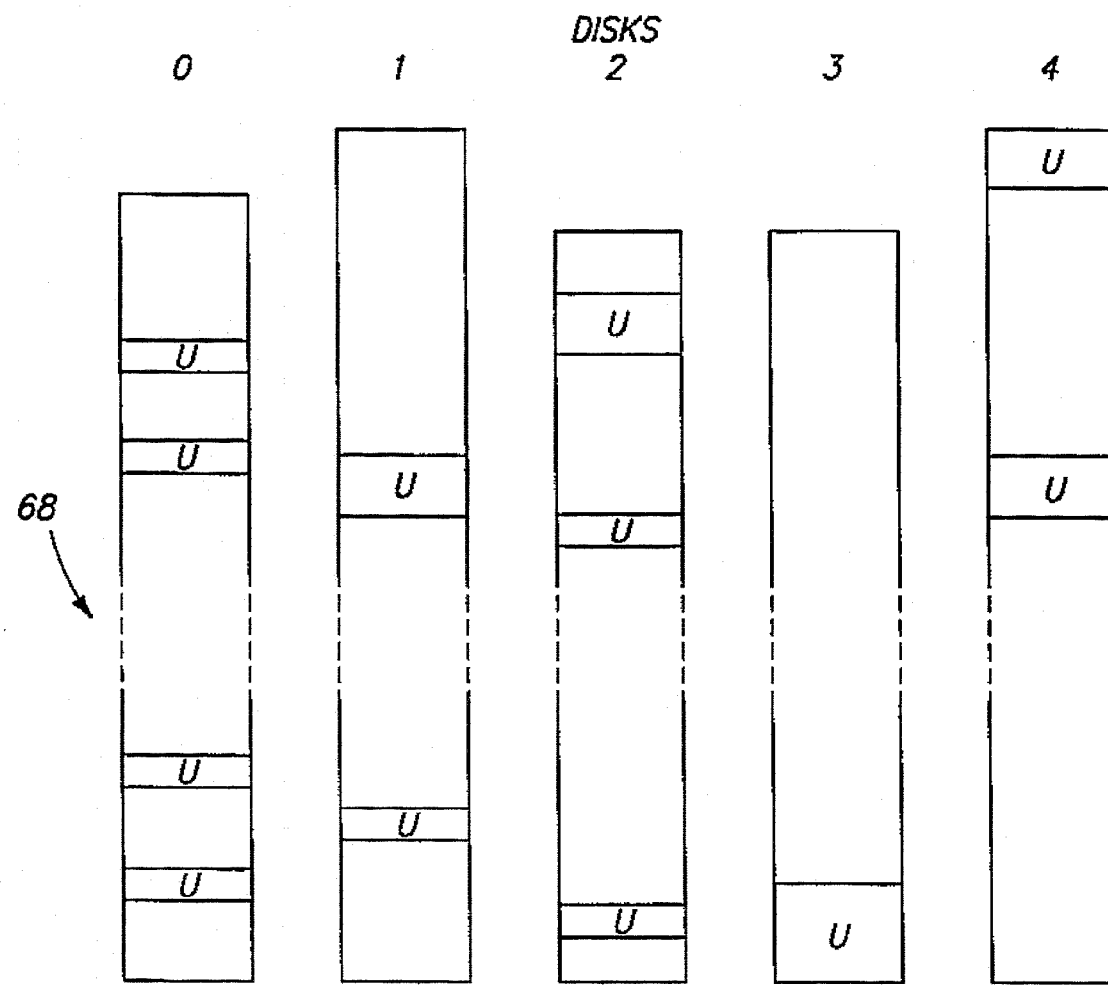
FIG. 6 is a diagrammatic illustration of storage space on multiple storage disks and demonstrates how the non-contiguous unused storage space is equivalent in size to one or more RAID areas.

FIG. 6 shows this space reservation technique. An example heterogeneous disk array 68 is depicted as comprising five storage disks 0–4 of varying capacities. Unused storage space (represented by the label "U") is distributed across the storage disk in a non-contiguous manner. The reserved storage space is the logical equivalent to one RAID area. That is, if all the unused storage space U distributed throughout the disks were accumulated, it would fill at least one contiguous RAID area (reserved space U0–U4).

It is noted that the amount of unused storage space is equivalent to the size of one largest parity RAID area. In a heterogenous disk array, a largest RAID area is one that spans all of the disks in the disk array, as some non-largest RAID areas may span less than all disks. In a homogenous disk array where all storage disks are the same size, all RAID areas span all storage disks. Thus, each RAID area can be considered as the largest.

At step 64, the RAID management system maps the RAID-level virtual storage space into a second or application-level virtual storage space 50 which presents the physical storage space as multiple virtual blocks. The application-level virtual storage space does not see the capacity provided by the reserved storage space. At step 66 in FIG. 5, RAID management system 16 migrates data between mirror and parity RAID areas using the unused storage space, as described above in the two enumerated processes discussed with reference to FIG. 4. This data migration helps ensure that the data storage system does not place too much data in mirror storage such that the one parity RAID area threshold of unused storage space is violated.

The unused storage space reservation technique of this invention is advantageous because the unused space can be distributed in a non-contiguous manner throughout different RAID areas, and across multiple storage disks. There is no requirement that contiguous reserved storage be guaranteed. As a result, the system can be designed without difficult and complex operations, such as nesting transactions, which guarantee a specific configuration of physical storage space.

Non-contiguous unused storage space is collected or used in differing ways depending upon the operation in progress. In general, the reserved amount is used to help create usable allocation blocks for storage of user or unused RAID areas that can be converted to mirror or parity RAID areas as needed. Two operations of particular interest concern (1) writing a single virtual block to mirrored storage and (2) rewriting whole RAID areas. In the first operation, a method for writing a single virtual block includes a sequence of gathering unused storage space via a technique called "garbage collection" and migration of data from mirror to parity storage. The garbage collection/migration method is described in more detail with reference to FIGS. 7–9. In the second operation, a method for rewriting whole RAID areas concerns emptying a partially filled RAID area in order to convert the emptied RAID area to a mirror or parity RAID area as needed via a technique called "bootstrapping". The bootstrapping method is described in more detail with reference to FIGS. 10 and 11.

Figure 7:
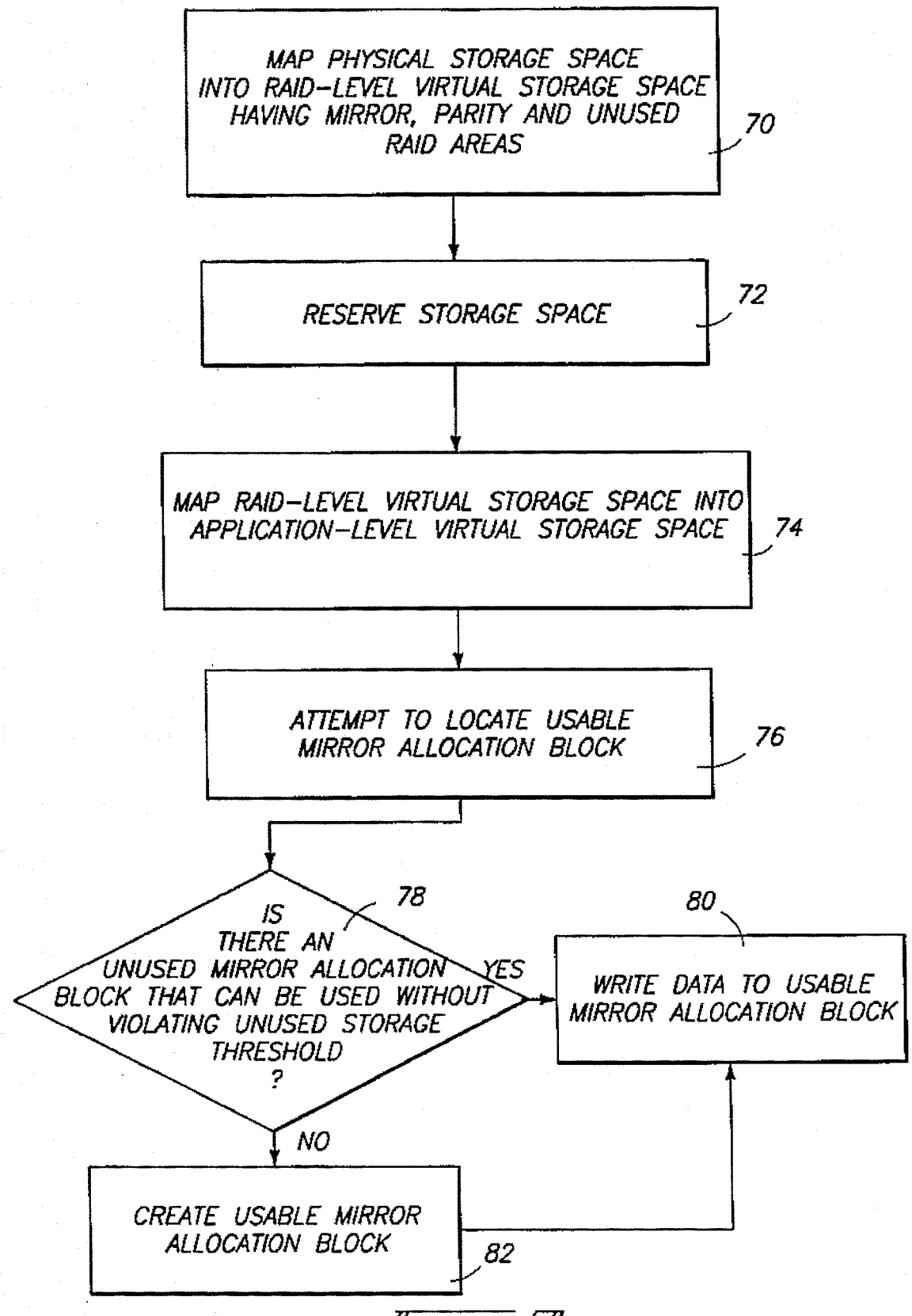
FIG. 7 is a flow diagram of another preferred method for using the reserved amount of unused storage space to create mirror allocation blocks.

FIG. 7 shows the method for writing data to single mirror virtual blocks of mirror storage. The initial three steps 70, 72, and 74 are essentially identical to steps 60, 62, and 62, which are described above with reference to FIG. 5. These three steps create the two levels of virtual storage space described above in detail with reference to FIG. 4, while reserving an amount of unused storage space in the RAID-level virtual storage space that is equivalent in size to one RAID area. It is noted that the RAID-level virtual storage space mapped in step 70 includes unused RAID areas which have not been designated as mirror or parity RAID areas and are therefore free to be used as either.

When it is time to write data to a single virtual block, the RAID management system 16 first attempts to locate a usable mirror allocation block in the RAID-level virtual storage space that can be associated with the single virtual block (step 76). If there is a usable mirror allocation block that can be used without violating the one RAID area threshold of unused storage space reserved for migration (i.e., the "yes" branch from decisional step 78), data is simply written to the located mirror allocation block (step 80). On the other hand, if a usable mirror allocation block can not be found (i.e., the "no" branch from decisional step 78), the RAID management system creates at least one usable mirror allocation block (step 82). Thereafter, data is written to the created mirror allocation block(s).

Figure 8:
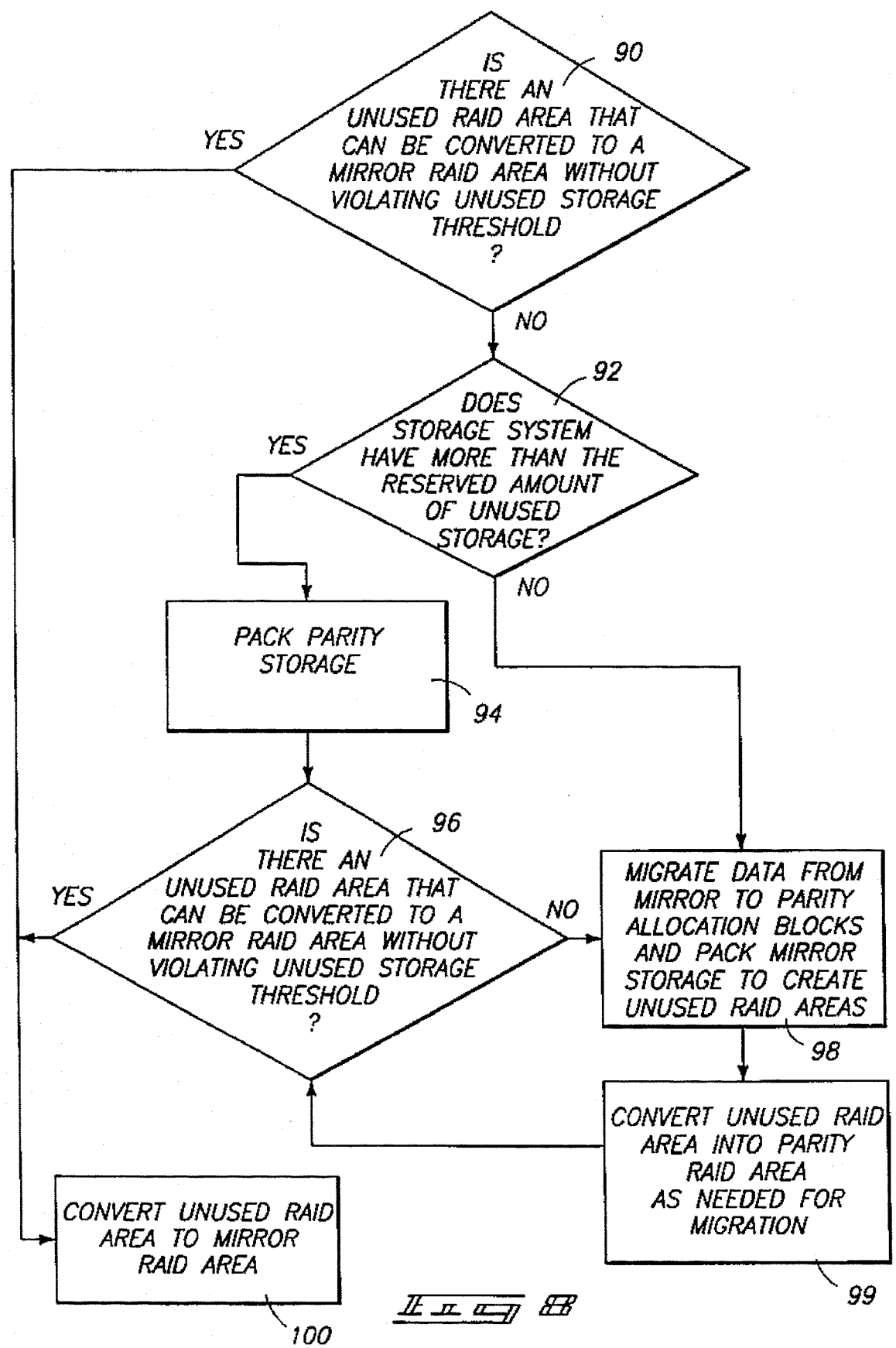
FIG. 8 is a flow diagram of specific techniques used to create mirror allocation blocks, including a garbage collection technique.

FIG. 8 illustrates preferred techniques for creating usable mirror allocation blocks per step 82. The techniques are preferably conducted in sequential order as shown until at least one usable mirror allocation block is created. At step 90, it is determined whether there is any unused RAID area that can be converted to a mirror RAID area without violating the one RAID area threshold for unused storage space. This determination is made because conversion of an unused RAID area to a mirror RAID area might shrink the available storage space to a point where the one RAID area threshold for unused storage space is violated. The threshold is assumed to be equivalent in size to the largest parity RAID area. For a disk array of N disks, a parity RAID area has a multiple m of N–1 allocation blocks for storage of user data and allocation blocks for redundancy data. In contrast, a mirror RAID area has a multiple of N/2 allocation blocks for storage of user data and N/2 allocation blocks for redundancy data. Conversion from an unused RAID area, which can be converted to either a mirror or parity RAID area, effectively reduces storage space by a multiple of N/2 - (N–1). Thus, the conversion may violate the one RAID area threshold for unused storage.

If there is an unused RAID area that can be converted to a mirror RAID area without violating the unused threshold (i.e., the "yes" branch from step 90), the RAID management system converts the unused RAID area to a mirror RAID area (step 100). If successful, this technique creates at least one mirror allocation block. Data can then be written to the usable mirror allocation block within the new mirror RAID area. The process can then be halted.

If there is not an unused RAID area that can be converted to mirror storage (i.e., the "no" branch from step 90), the RAID management system next determines whether the storage system has more unused allocation blocks than the reserved threshold amount of unused storage (step 92). If it does, the RAID management system conducts a second space management technique which packs the parity storage with the goal of producing an unused RAID area (step 94).

Figure 9:
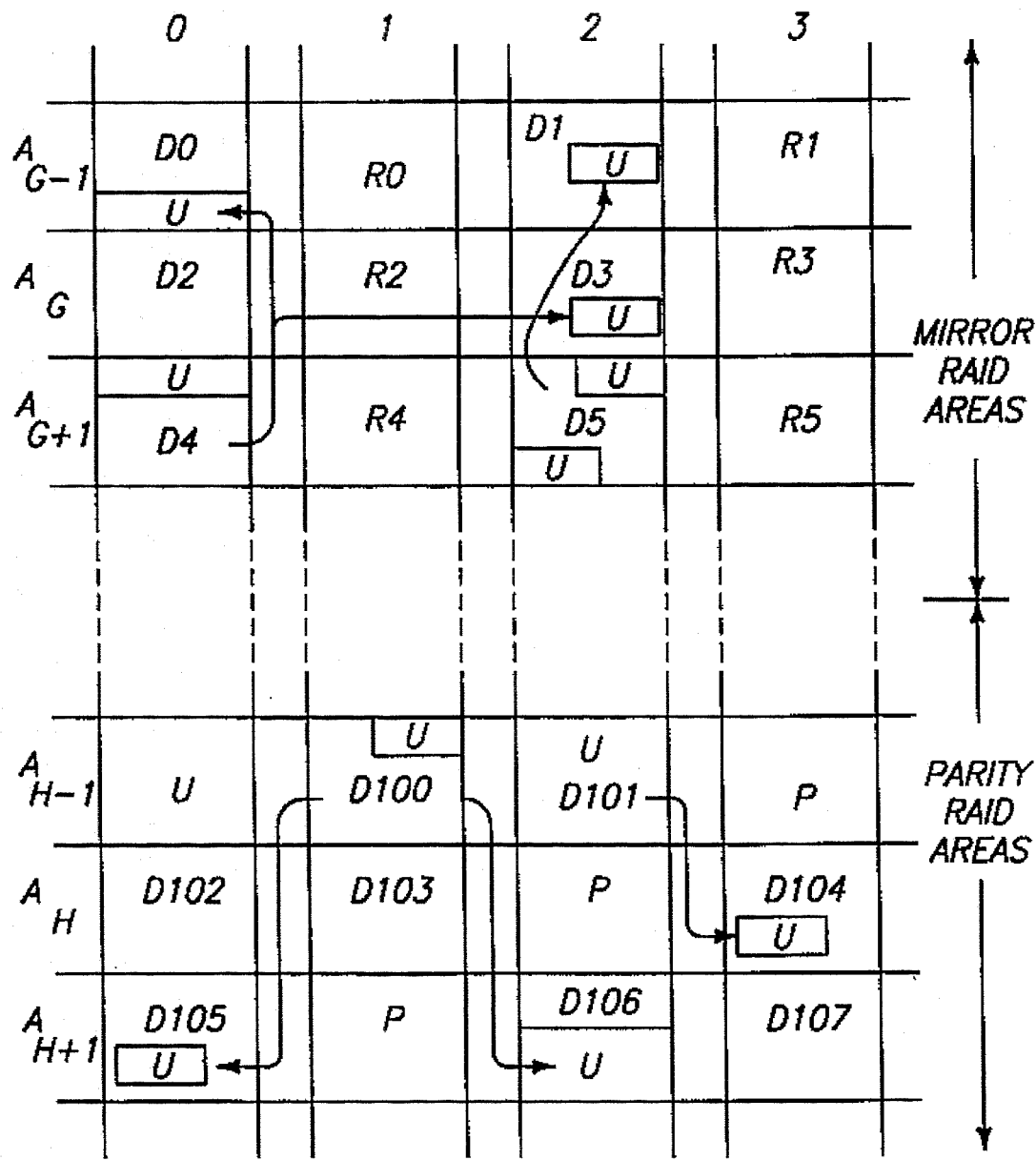
FIG. 9 is a diagrammatic illustration of storage space on multiple storage disks and demonstrates the garbage collection technique of FIG. 8.

The parity storage packing is done using the garbage collection process illustrated in FIG. 9. FIG. 9 shows a section of a disk array 86 containing four storage disks 0–3. For convenience, assume that the RAID areas of the RAID-level virtual storage space are mapped contiguously onto areas $A_{G-1}, A_G, A_{G+1}, \ldots, A_{H-1}, A_H, A_{H+1}, \ldots$, etc. Areas $A_{G-1}, A_G, A_{G+1}$ are used for mirror storage and areas $A_{H-1}, A_H, A_{H+1}$ are associated with parity storage. The regions in the mirror RAID areas contain allocation blocks filled with data D0–D5 and allocation blocks provided with mirror redundancy R0–R5. The regions in the parity RAID areas contain allocation blocks holding data D100–D107 and allocation blocks provided for parity redundancy P. The enclosed boxes having the identifying label "U" represent reserved unused storage space.

To gather unused parity allocation blocks into an unused RAID area (i.e., the parity packing step 94 of FIG. 8), data is moved from a selected parity RAID area to the unused storage space U in other parity RAID areas. In FIG. 9, assume that the parity RAID area associated with physical area $A_{H-1}$ is selected. Data D100 is moved to unused storage space U located in RAID area $A_{H+1}$. Similarly, data D101 is moved to unused storage space U in RAID area $A_H$. This data movement effectively fills the "holes" in the parity RAID areas, making RAID area $A_{H+1}$ more full. At the same time, the data movement collects the unused storage space into the same RAID area. Here, the selected parity area $A_{H-1}$ is now entirely empty. It can therefore be classified as an unused RAID area.

At the application-level virtual storage space, the pointers in the virtual block table are updated to reflect the data movement. This effectively gathers unused allocation blocks into an unused RAID area (i.e., the emptied parity RAID area associated with physical area $A_{H-1}$).

At step 96 in FIG. 8, the RAID management system determines whether this packing step created an unused RAID area that can be converted to a mirror RAID area without violating the one RAID area threshold for reserved storage space. If it did (i.e., the "yes" branch from step 96), the created unused RAID area is converted to a mirror RAID area which contains at least one usable mirror allocation blocks (step 100) to which data can be written. With respect to FIG. 9, the data can be stored according to mirror redundancy techniques in physical area $A_{H-1}$, thereby re-associating that area as a mirror RAID area.

On the other hand, if the packing step failed to yield an unused RAID area that can be converted to mirror storage (i.e., the "no" branch from step 96), the RAID management system performs a third technique of alternately migrating data from mirror allocation blocks to parity allocation blocks, and then gathering the mirror storage to create an unused RAID area (step 98). It is noted that this migration/gathering technique of step 98 can also be reached via the "no" branch from step 92, in the event that the storage system does not have more unused allocation blocks than the reserved threshold amount.

According to the subprocess of step 98, the RAID management system migrates data from a mirror allocation block to a parity allocation block using any unused parity allocation blocks or by converting unused RAID areas to parity. The mirror storage may then be packed with the goal of producing an unused RAID area.

The gathering of unused mirror allocation blocks is also shown in FIG. 9. For example, assume that data is moved from a selected mirror RAID area, such as that associated with physical area $A_{G+1}$, to the unused storage space U in other mirror storage areas. Data D4 is moved to unused storage space U located in RAID areas $A_{G-1}$ and $A_G$. Similarly, data D5 is moved to unused storage space U in RAID area $A_{G-1}$. The data movement fills the "holes" in the mirror RAID areas while simultaneously collecting the unused storage space into the same RAID area. The selected mirror area $A_{G+1}$ is now entirely empty and can be classified as an unused RAID area.

As above, at the application-level virtual storage space, the pointers in the virtual block table are updated to reflect the data movement. This effectively gathers unused allocation blocks into an unused RAID area (i.e., the emptied mirror RAID area associated with physical area $A_{G+1}$).

The migration and packing steps are repeatedly performed until an unused RAID area is created. Since storing user data in mirror storage occupies more physical storage space compared to storing the same user data in parity storage, migration of mirror allocation blocks to parity RAID areas will result in a net increase in the amount of unused storage. Once an unused RAID area is created, it can be converted to a parity RAID area for additional migration (step 99). Steps 98 and 99 are repeatedly performed until there exists an unused RAID area that can be converted to a mirror RAID area without violating the reserved unused storage threshold per step 96. Because of the reserved amount of unused storage, this process is guaranteed to empty mirror RAID areas so that they can be converted to parity RAID areas. That is, the disk array data storage system can shrink mirror storage as much as needed to satisfy the capacity committed for user data.

The techniques described in FIG. 8 are conducted in the preferred order as shown because each preceding step is less costly from a time and resource standpoint to create usable mirror allocation blocks. In other less preferred embodiments, however, the techniques for creating usable mirror allocation blocks can be conducted in other sequences.

The protocol used to create unused mirror allocation blocks is advantageous because it permits the RAID management system to selectively adjust the memory allocation between parity and mirror areas according to the amount of user data and the size of physical storage space. As data usage and storage capacity vary, the RAID management system maximizes the amount of data held in mirror storage. Thus, most-recently or most-frequently used data is maintained in mirror storage to optimize performance and reliability.

The RAID management system attempts to avoid the situation in which a storage request must wait for the space-making sequence to yield an unused mirror allocation block by creating unused RAID areas during idle time. However, in some situations, conflicts may arise when storage requests are made during the space-making sequence. The RAID management system resolves any conflicts when the space-making procedures are completed.

Figure 10:
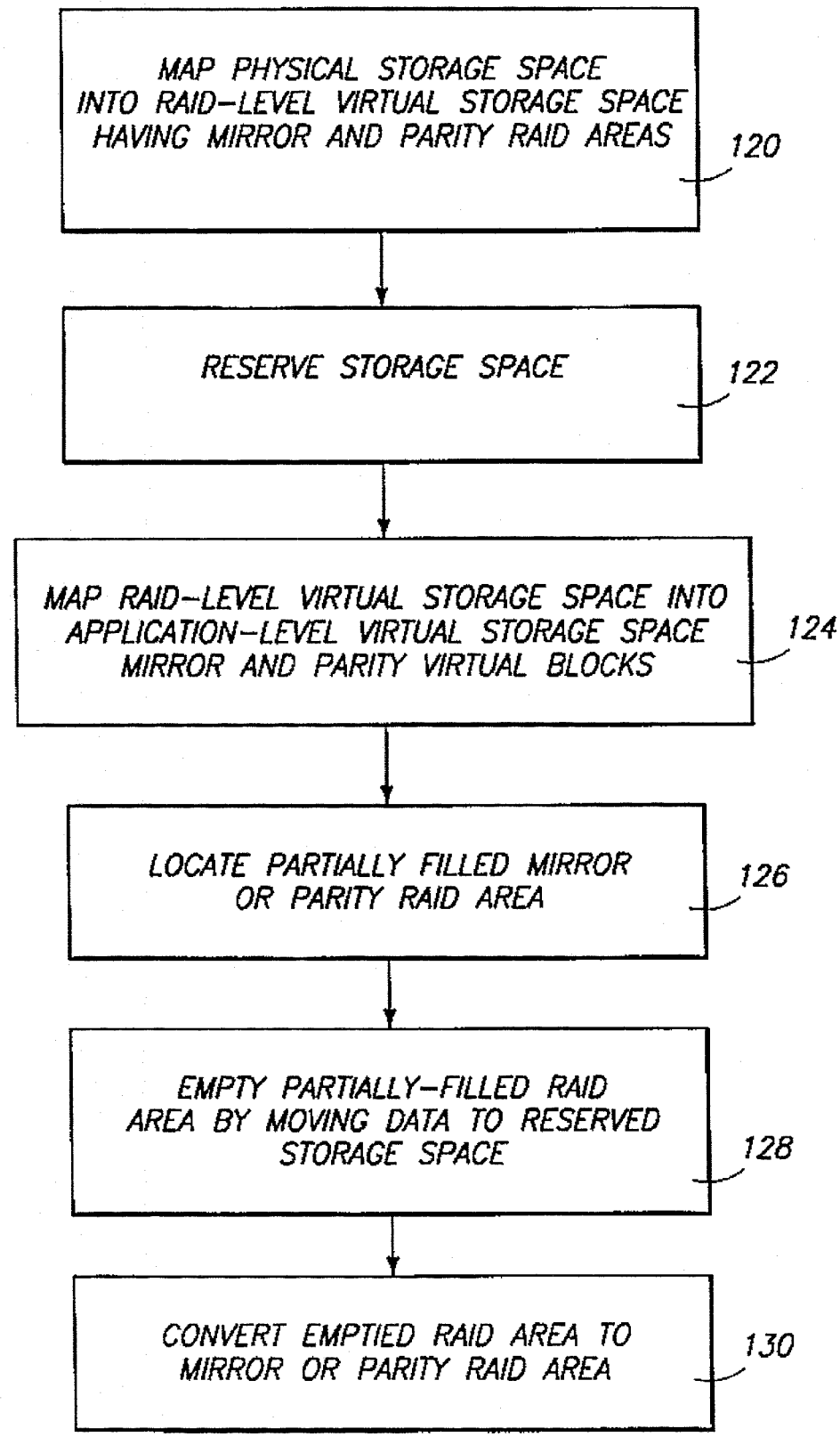
FIG. 10 is a flow diagram of yet another preferred method for using reserved amount of unused storage space in a bootstrapping technique which empties a partially filled RAID area.

FIG. 10 shows the method for rewriting whole RAID areas using the "bootstrapping" technique. The initial three steps 120, 122, and 124 again create the two layer mapping structure described above with respect to FIG. 4, while reserving an amount of unused storage space equivalent to one RAID area.

At step 126, the RAID management system locates a mirror or parity RAID area that is partially filled with user data. In one preferred implementation, the RAID management system searches for the least filled mirror or parity RAID area. The RAID management system then empties the partially filled RAID area by moving the remaining data to unused storage space within the disk array (step 128). The data can be moved to any unused storage space in either mirror or parity storage. This process yields a whole RAID area that is empty.

The emptied RAID area can then be converted to a mirror or parity RAID area as needed (step 130). For instance, data from another RAID area (mirror or parity) can be moved or rewritten to this empty RAID area to facilitate various operations where large scale data movement is desirable from a performance and efficiency perspective. It is desirable, for example, to shuffle whole RAID areas during a rebuild operation (where data redundancy is restored following a disk failure) or a balancing operation (where RAID areas are expanded one-by-one to incorporate new storage space created by adding one or more additional storage disks).

Figure 11:
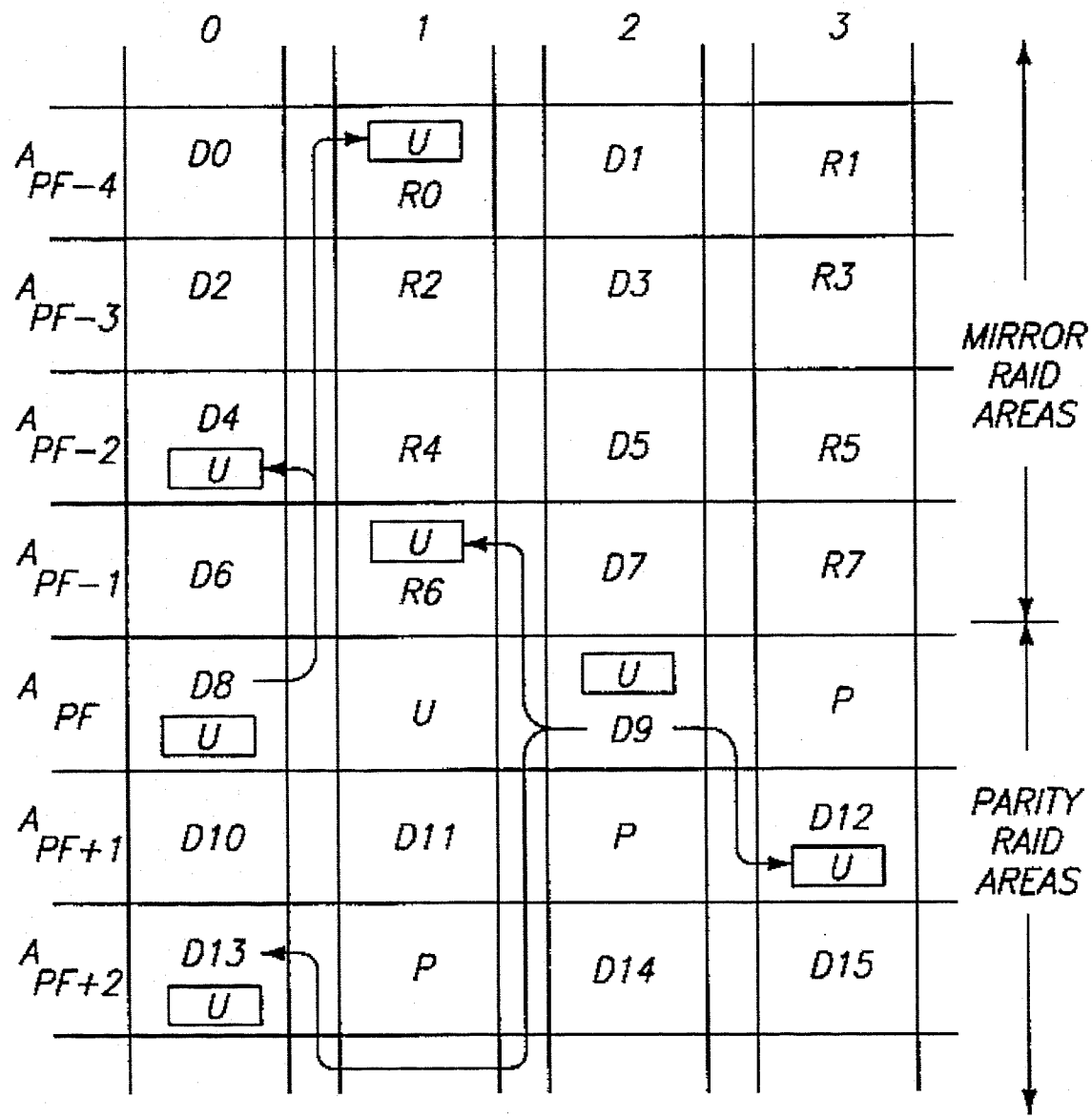
FIG. 11 is a diagrammatic illustration of storage space on multiple storage disks and demonstrates the bootstrapping technique of FIG. 10.

FIG. 11 diagrammatically illustrates the bootstrapping technique of FIG. 10. FIG. 11 shows a section of a disk array 140 containing five storage disks 0–4. For convenience, assume that the RAID areas of the RAID-level virtual storage space are mapped contiguously onto areas $A_{PF-4}$ to $A_{PF+2}$. The regions of each RAID area on the various disks contain allocation blocks for data D0–D15, allocation blocks for mirror redundancy R0–R7 and parity redundancy P, and unused allocation blocks, designated by "U" enclosed in a box. Because of the reserved threshold, the number of unused allocation blocks is greater than or equal to the number of allocation blocks in the largest possible parity RAID area in an N-disk array.

For this example, suppose that the RAID management system has identified RAID area $A_{PF}$ as the partially-filled RAID area (step 126 in FIG. 10). The remaining data in the selected partially filled RAID area $A_{PF}$ is moved to the unused storage space in other RAID areas. Data D8 is moved to unused storage space U in mirror RAID areas $A_{PF-4}$ and $A_{PF-2}$ and data D9 is moved to unused storage space U in mirror RAID area $A_{PF-1}$ and parity RAID areas $A_{PF+1}$ and $A_{PF+2}$. The data is moved to reserved storage space in the RAID areas throughout the disk array regardless of the level of storage. This process empties the selected RAID area so that it contains no data. The selected RAID area $A_{PF}$ can now be converted into a mirror or parity RAID area.

The bootstrapping process differs from the above garbage collection process in that the data can fill "holes" in any storage level, irrespective of whether the data was originally in a mirror or parity RAID area. The process does not completely preserve the maintenance of most-recently or most-frequently used data in mirror storage, but is useful for large rewrites of data in the disk array. The bootstrapping process is simpler and faster than the above garbage collection process.

The methods of this invention have many benefits. First, storage space can be used for migration and thus RAID area conversion wherever it is found in the RAID-level virtual storage space. The data storage system therefore does not need to be designed to support nested transactions which guarantee a specific location or configuration of space reserved for migration between storage types. Second, the methods permit maximum flexibility to storage type sizes by easily adopting to homogeneous or heterogenous disk arrays. Third, the methods seek to optimize performance and reliability by keeping as much data in mirror storage as possible.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for using a reserved amount of unused storage space in a hierarchic data storage system; the data storage system comprising multiple storage disks that define a physical storage space; the method comprising the following steps:

mapping the physical storage space into a RAID-level virtual storage space having multiple first and second RAID areas, the first RAID areas having first allocation blocks which store data according to a first RAID level and the second RAID areas having second allocation blocks which store data according to a second RAID level;

providing a reserved amount of unused storage space within the RAID-level virtual storage space;

mapping the RAID-level virtual storage space into an application-level virtual storage space having multiple virtual blocks;

migrating data from a first used allocation block to a second used allocation block so that the data once stored according to one of the first or second RAID levels is now stored according to the other of the first or second RAID levels, whereby following said migrating, the second allocation block is used and the first allocation block becomes unused, thereby conserving the amount of unused storage space.

2. A method according to claim 1 further comprising:

providing N storage disks in the data storage system; and providing a reserved amount of unused storage space that is equivalent to at least a number of virtual blocks that can be stored in a largest possible RAID area of a multiple of N−1.

3. A method for using reserved storage space in a hierarchic data storage system; the data storage system comprising multiple storage disks that define a physical storage space; the method comprising the following steps:

mapping the physical storage space into a RAID-level virtual storage space having mirror, parity, and unused RAID areas; the mirror RAID areas having mirror allocation blocks which store data according to mirror redundancy, the parity RAID areas having parity allocation blocks which store data according to parity redundancy, and the unused RAID areas containing no data;

providing a minimum reserved amount of unused storage space within the RAID-level virtual storage space that can be allowed to distribute across the storage disks;

mapping the RAID-level virtual storage space into an application-level virtual storage space having multiple virtual blocks;

attempting to locate a usable mirror allocation block;

in the event that a usable mirror allocation block is located, writing data to the mirror allocation block; and in the event that no usable mirror allocation block is located, creating a usable mirror allocation block to receive the data by conducting at least one of the following additional steps:

(1) locating an unused RAID area and converting it to a mirror RAID area containing a usable mirror allocation block;

(2) gathering empty mirror allocation blocks or empty parity allocation blocks into an unused RAID area that may be used to create a mirror RAID area; and (3) migrating data from mirror allocation blocks to parity allocation blocks and gathering unused mirror allocation blocks into unused RAID areas.

4. A method according to claim 3 wherein the step of creating a usable mirror allocation block comprises the following steps in sequential order until a usable mirror allocation block is created:

(1) locating an unused RAID area and converting it to a mirror RAID area containing a usable mirror allocation block;

(2) gathering empty parity allocation blocks into an unused RAID area and converting the unused RAID area to a mirror RAID area containing a usable mirror allocation block; and (3) alternately performing the following steps (a) and (b) until an unused RAID area is created, then performing step (c):

(a) migrating data from a mirror allocation block to a parity allocation block to empty the mirror allocation block;

(b) gathering the empty mirror allocation block into an unused RAID area; and (c) following said steps (3)(a) and (3)(b), converting the unused RAID area into a parity RAID area;

repeating said steps (3)(a)–(3)(c) until an unused RAID area is created that can be converted into a mirror RAID area without violating the minimum reserved amount of unused storage space.

5. A method for using a reserved amount of unused reserved storage space in a hierarchic data storage system; the data storage system comprising multiple storage disks that define a physical storage space; the method comprising the following steps:

mapping the physical storage space into a RAID-level virtual storage space having multiple first and second RAID areas, the first RAID areas having first allocation blocks which store data according to a first RAID level and the second RAID areas having second allocation blocks which store data according to a second RAID level;

providing a minimum number of unused allocation blocks within the RAID-level virtual storage space that can be distributed across the storage disks;

mapping the RAID-level virtual storage space into an application-level virtual storage space having multiple virtual blocks;

migrating data between the first and second allocation blocks so that the data once stored according to one of the first or second RAID levels is now stored according to the other of the first or second RAID levels;

locating a first or second RAID area that is partially filled with data; and emptying the located RAID area by moving the data from the located RAID area to unused allocation blocks.

6. A method according to claim 5 further comprising:

providing N storage disks in the data storage system; and providing a reserved amount of unused storage space that is equivalent to at least a number of virtual blocks that can be stored in a largest possible RAID area of a multiple of N−1.

7. A method according to claim 5 wherein the locating step comprises locating a first or second RAID area that contains the least amount of data stored therein.

8. A method according to claim 5 further comprising the additional step of rewriting data from a whole RAID area to the emptied RAID area.

9. A method according to claim 5 further comprising the additional step of converting the emptied RAID area to one of a mirror or parity RAID area.

10. A method according to claim 5 wherein:

the step of providing a minimum number of unused allocation blocks comprises providing unused allocation blocks in both the first and second RAID areas; and the step of emptying a located RAID area comprises moving data from the located RAID area to unused allocation blocks in both the first RAID areas of the first RAID level and the second RAID areas of the second RAID level.

* * * * *